United States Patent
Li

(10) Patent No.: US 10,439,071 B2
(45) Date of Patent: Oct. 8, 2019

(54) THIN FILM TRANSISTORS AND THE MANUFACTURING METHODS THEREOF, AND ARRAY SUBSTRATES

(71) Applicant: Shenzhen China Star Optoelectronics Technology Co., Ltd., Shenzhen, Guangdong (CN)

(72) Inventor: Ziran Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 41 days.

(21) Appl. No.: 15/542,630

(22) PCT Filed: Jun. 15, 2017

(86) PCT No.: PCT/CN2017/088394
§ 371 (c)(1),
(2) Date: Jul. 10, 2017

(87) PCT Pub. No.: WO2018/184294
PCT Pub. Date: Oct. 11, 2018

(65) Prior Publication Data
US 2018/0294358 A1   Oct. 11, 2018

(51) Int. Cl.
*H01L 27/14* (2006.01)
*H01L 29/04* (2006.01)
(Continued)

(52) U.S. Cl.
CPC ...... *H01L 29/7869* (2013.01); *H01L 27/1225* (2013.01); *H01L 27/1262* (2013.01);
(Continued)

(58) Field of Classification Search
None
See application file for complete search history.

(56) References Cited

U.S. PATENT DOCUMENTS 6,190,951 B1    2/2001  Nakahori
6,696,327 B1*   2/2004  Brask ................ H01L 21/28185
                                                    257/E21.634

(Continued)

FOREIGN PATENT DOCUMENTS

CN    102769039 A    11/2012
CN    103824887 A    5/2014
(Continued)

*Primary Examiner* — Calvin Y Choi
(74) *Attorney, Agent, or Firm* — Andrew C. Cheng

(57) ABSTRACT

The present disclosure relates to a TFT including a gate on a substrate; a gate insulation layer on the substrate and the gate, and a surface of the gate insulation layer being applied with a flattening process; an oxygen-rich layer on the gate insulation layer; an active layer on the oxygen-rich layer; a source and a drain on the active layer; and a passivation layer on the active layer, the source, and the drain. In addition, the present disclosure also relates to a manufacturing method of the TFTs and the array substrate having the TFTs. By applying the flattening process to the surface of the gate insulation layer and by forming the oxygen-rich layer on the gate insulation layer, the surface of the gate insulation layer is smooth so as to eliminate the oxygen vacancy defects on the surface of the gate insulation layer. Thus, the surface state of the gate insulation layer is stable.

5 Claims, 4 Drawing Sheets

(51) Int. Cl.
*H01L 29/15* (2006.01)
*H01L 31/036* (2006.01)
*H01L 29/786* (2006.01)
*H01L 29/66* (2006.01)
*H01L 27/12* (2006.01)
*H01L 29/49* (2006.01)

(52) U.S. Cl.
CPC .... *H01L 29/4908* (2013.01); *H01L 29/66742* (2013.01); *H01L 29/66969* (2013.01); *H01L 29/78606* (2013.01)

(56) References Cited

U.S. PATENT DOCUMENTS

| | | | | |
|---|---|---|---|---|
| 2013/0193432 A1* | 8/2013 | Yamazaki | ............ | H01L 29/7869 257/43 |
| 2014/0073103 A1* | 3/2014 | Won | ................ | H01L 21/82346 438/287 |
| 2014/0084282 A1* | 3/2014 | Cao | .................... | H01L 29/7869 257/43 |

FOREIGN PATENT DOCUMENTS

| | | |
|---|---|---|
| CN | 104282769 A | 1/2015 |
| CN | 105789052 A | 7/2016 |
| JP | 2000174279 A | 8/2001 |

\* cited by examiner

THIN FILM TRANSISTORS AND THE MANUFACTURING METHODS THEREOF, AND ARRAY SUBSTRATES

BACKGROUND OF THE INVENTION

1. Field of the Invention

The present disclosure relates to display technology, and more particularly to a thin film transistor (TFT) and the manufacturing method thereof, and an array substrate.

2. Discussion of the Related Art

With respect to Indium Gallium Zinc Oxide (IGZO) TFTs, an active layer made of IGZO is grown on the gate insulating layer, that is, the gate insulating layer material and the quality of the surface of the gate insulation layer may have great impact on the performance of the IGZO TFTs.

At present, the gate insulation layer of the IGZO TFTs is generally made of orthosilicate (TEOS) or silicon dioxide (SiO2), the smoothness of the surface is not good enough, and the oxygen vacancy defects may exist, which causes unstable surface. Thus, the interface between the IGZO active layer material deposited thereon is also changed. The front channel layer of the TFT is formed near the interface, which is the transport path of carriers. Thus, after the active layer is deposited, a high concentration of defects are formed at the interface with the gate insulating layer. The defects may capture the carriers and may reduce the carrier mobility, making the characteristics of the device unstable. Thus, the reverse current may increase or the breakdown voltage may drop.

SUMMARY

To overcome the above-mentioned problem, the TFT and the manufacturing method thereof, and the array substrate are proposed to enhance the surface characteristics of the gate insulation layer.

In one aspect, a thin film transistor (TFT) includes: a gate on a substrate; a gate insulation layer on the substrate and the gate, and a surface of the gate insulation layer being applied with a flattening process; an oxygen-rich layer on the gate insulation layer;

an active layer on the oxygen-rich layer; a source and a drain on the active layer; a passivation layer on the active layer, the source, and the drain.

Wherein a surface of the gate insulating layer is treated with hydrofluoric acid having a mass percentage equaling to 0.5 to 2% for 30 seconds to 120 seconds.

Wherein the surface of the gate insulating layer is treated with 20 PPM to 30 PPM of ozone water for 60 to 90 seconds to form the oxygen-rich layer.

Wherein the active layer is made by Indium Gallium Zinc Oxide (IGZO).

In another aspect, an array substrate includes: a substrate; a gate on the substrate; a gate insulation layer on the substrate and the gate, and a surface of the gate insulation layer being applied with a flattening process; an oxygen-rich layer on the gate insulation layer; an active layer on the oxygen-rich layer; a source and a drain on the active layer; a passivation layer on the active layer, the source, and the drain; a pixel electrode on the passivation layer having a through hole exposing the drain, and the pixel electrode connects to the drain via the through hole.

In another aspect, a manufacturing method of TFTs includes: providing a substrate; forming a gate on the substrate; forming a gate insulation layer on the substrate and the gate, and applying a flattening process to a surface of the gate insulation layer; forming an oxygen-rich layer on the gate insulation layer; forming an active layer on the oxygen-rich layer; forming a source and a drain on the active layer; forming a passivation layer on the source, the drain, and the active layer.

Wherein the step of forming the oxygen-rich layer on the gate insulation layer further includes: the surface of the gate insulating layer is treated with 20 PPM to 30 PPM of ozone water for 60 to 90 seconds to form the oxygen-rich layer.

Wherein the step of forming the active layer on the oxygen-rich layer further includes: depositing IGZO on the oxygen-rich layer to form an IGZO layer and applying a patterning process to the IGZO layer.

by applying the flattening process to the surface of the gate insulation layer and by forming the oxygen-rich layer on the gate insulation layer, the surface of the gate insulation layer is smooth so as to eliminate the oxygen vacancy defects on the surface of the gate insulation layer. Thus, the surface state of the gate insulation layer is stable.

DETAILED DESCRIPTION OF THE EMBODIMENTS

Figure 1:
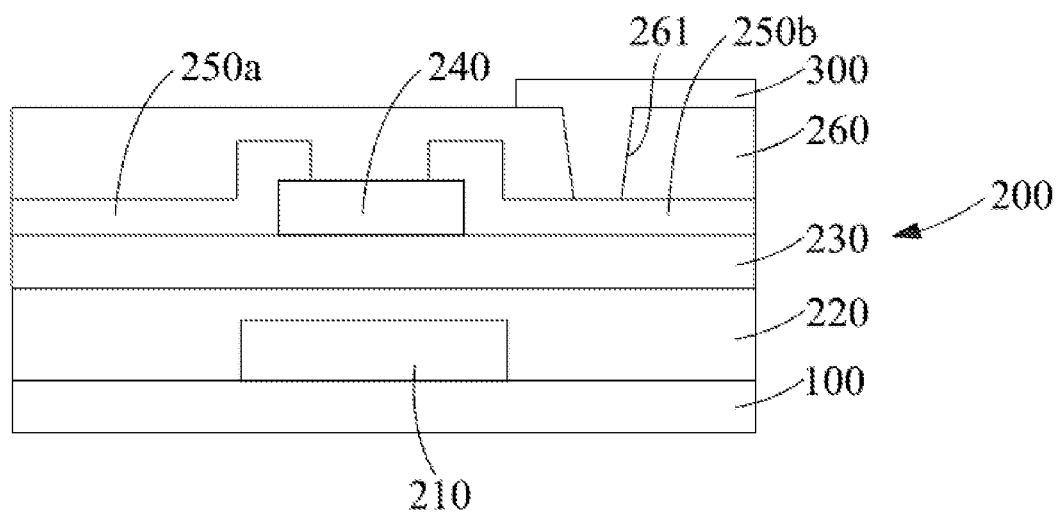
FIG. 1 is a schematic view of the array substrate in accordance with one embodiment of the present disclosure.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

FIG. 1 is a schematic view of the array substrate in accordance with one embodiment of the present disclosure.

Referring to FIG. 1, the array substrate includes a substrate 100, a TFT 200, and a pixel electrode 300. The TFT 200 and the pixel electrode 300 are arranged on the substrate 100, and the TFT 200 connects to a drain of the pixel electrode 300.

Specifically, the substrate 100 may be a transparent glass substrate or a resin substrate.

The TFT 200 includes a gate 210, a gate insulation layer 220, an oxygen-rich layer 230, an active layer 240, a source 250a, a drain 250b, and a passivation layer 260.

The gate 210 is arranged on the substrate 100. The gate 210 may be of single-layer made by Mo, or may be of multi-layer made by Mo/Al, Mo/Ti, or Mo/Cu.

The gate insulation layer 220 is arranged on the substrate 100 and the gate 210. The gate insulation layer 220 may be made by silicon oxide, silicon nitride/silicon oxide. In addition, a thickness of the gate insulation layer 220 may be in a range from 2000-5000 Å.

In one embodiment, the surface of the gate insulation layer 220 is applied with a flattening process, including: a surface of the gate insulating layer 220 is treated with hydrofluoric acid having a mass percentage equaling to 0.5 to 2% for 30 seconds to 120 seconds. In one example, the hydrofluoric acid having the mass percentage equaling to 1% is adopted to perform the flattening process toward the gate insulation layer 220 for 60 seconds.

The oxygen-rich layer 230 is arranged on the gate insulation layer 220. Specifically, the surface of the gate insulating layer 220 is treated with 20 PPM to 30 PPM of ozone water for 60 to 90 seconds to form the oxygen-rich layer 230. In an example, the surface of the gate insulating layer 220 is treated with 25 PPM of ozone water for 75 seconds. In this way, the oxygen-rich layer 230 is formed on the surface of the gate insulation layer 220 so as to eliminate the oxygen vacancy defects on the surface of the gate insulation layer 220.

The active layer 240 is arranged on the oxygen-rich layer 230. The active layer 240 is made by IGZO.

The source 250a and the drain 250b are arranged on the active layer 240. In addition, the source 250a and the drain 250b are spaced apart from each other. The source 250a and the drain 250b respectively extend onto the oxygen-rich layer 230 so as to cover the areas on the oxygen-rich layer 230 except for the active layer 240.

The passivation layer 260 is arranged on the source 250a, the drain 250b, and the active layer 240. The passivation layer 260 may be made by $SiO_x$. The passivation layer 260 includes a through hole 261 for exposing a portion of the drain 250b.

The pixel electrode 300 is arranged on the passivation layer 260, and the pixel electrode 300 connects to the drain 250b exposed by the through hole 261.

The manufacturing method of the array substrate will be illustrated hereinafter in view of FIGS. 2A-2I.

The manufacturing method includes the following steps.

Figure 2A:
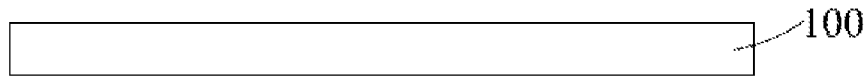
FIG. 2A-2I are flowcharts illustrating the manufacturing method of the array substrate in accordance with one embodiment of the present disclosure.

In step 1: referring to FIG. 2A, providing a substrate 100.

Specifically, the substrate 100 may be a transparent glass substrate or a resin substrate.

Figure 2B:
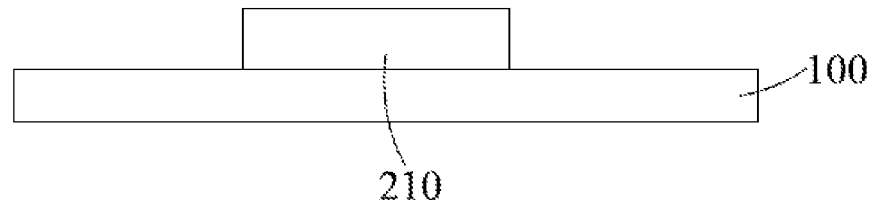

In step 2: referring to FIG. 2B, forming the gate 210 on the substrate 100. The gate 210 may be of single-layer made by Mo, or may be of multi-layer made by Mo/Al, Mo/Ti, or Mo/Cu.

Figure 2C:
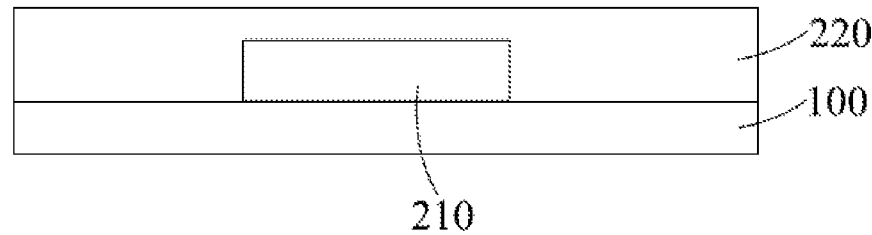

In step 3: referring to FIG. 2C, forming the gate insulation layer 220 on the substrate 100 and the gate 210, and applying a flattening process to the surface of the gate insulation layer 220. The gate insulation layer 220 may be made by silicon oxide, silicon nitride/silicon oxide. In addition, a thickness of the gate insulation layer 220 may be in a range from 2000-5000 Å.

In one embodiment, the surface of the gate insulation layer 220 is applied with a flattening process, including: a surface of the gate insulating layer 220 is treated with hydrofluoric acid having a mass percentage equaling to 0.5 to 2% for 30 seconds to 120 seconds. In one example, the hydrofluoric acid having the mass percentage equaling to 1% is adopted to perform the flattening process toward the gate insulation layer 220 for 60 seconds.

Figure 2D:
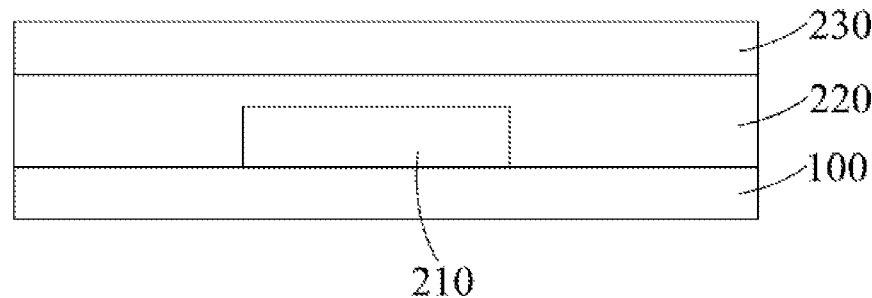

In step 4: referring to FIG. 2D, forming the oxygen-rich layer 230 on the gate insulation layer 220. Specifically, the surface of the gate insulating layer 220 is treated with 20 PPM to 30 PPM of ozone water for 60 to 90 seconds to form the oxygen-rich layer 230. In an example, the surface of the gate insulating layer 220 is treated with 25 PPM of ozone water for 75 seconds. In this way, the oxygen-rich layer 230 is formed on the surface of the gate insulation layer 220 so as to eliminate the oxygen vacancy defects on the surface of the gate insulation layer 220.

Figure 2E:
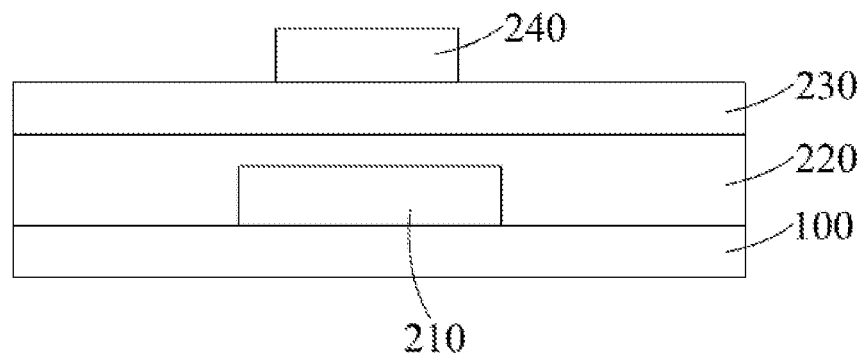

In step 5: referring to FIG. 2E, forming the active layer 240 on the oxygen-rich layer 230. The active layer 240 may be made by IGZO.

Figure 2F:
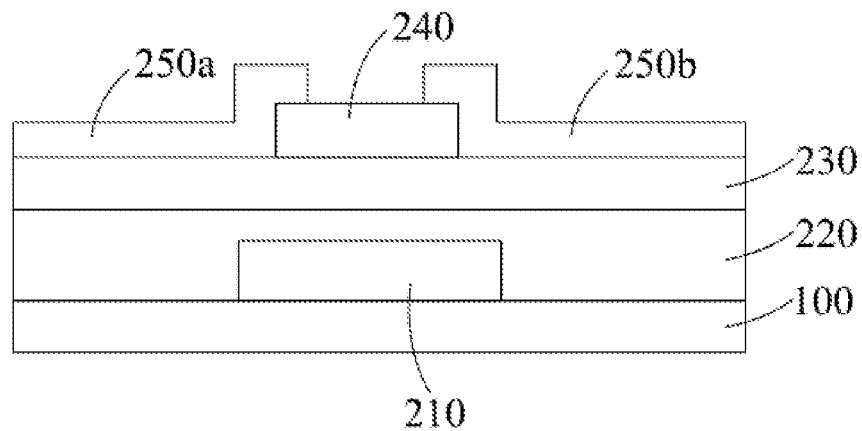

In step 6: referring to FIG. 2F, forming the source 250a and the drain 250b on the active layer 240. In addition, the source 250a and the drain 250b are spaced apart from each other. The source 250a and the drain 250b respectively extend onto the oxygen-rich layer 230 so as to cover the areas on the oxygen-rich layer 230 except for the active layer 240.

Figure 2G:
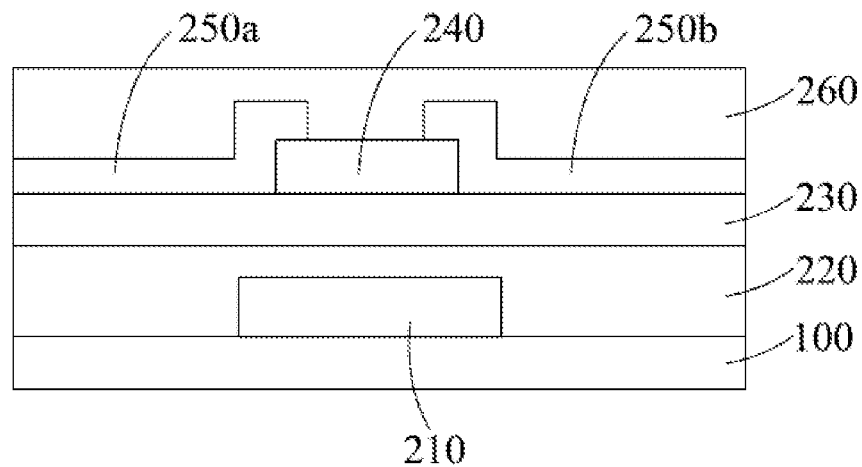

In step 7: referring to FIG. 2G, forming the passivation layer 260 on the source 250a, the drain 250b, and the active layer 240. The passivation layer 260 may be made by $SiO_x$. The passivation layer 260 includes a through hole 261 for exposing a portion of the drain 250b.

The TFT 200 may be obtained by conducting steps 2-7.

Figure 2H:
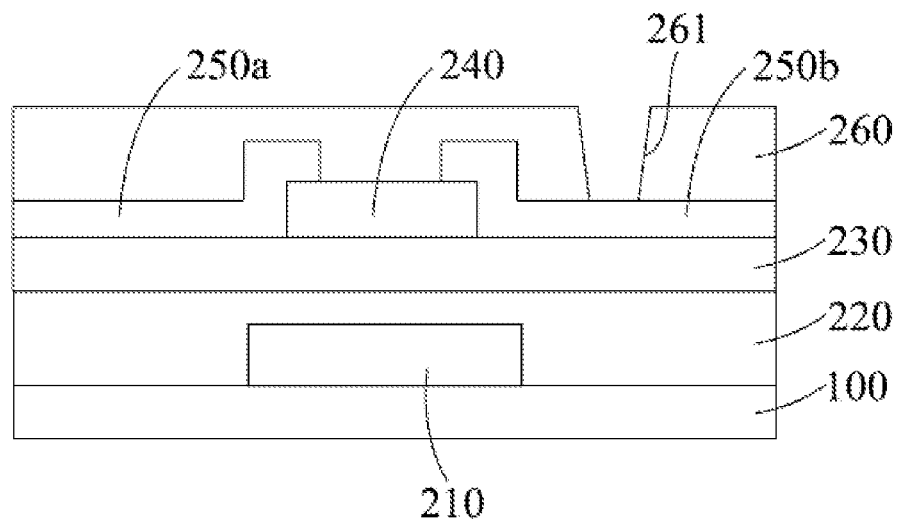

In step 8: referring to FIG. 2H, forming the through hole 261 on the passivation layer 260, and the through hole 261 exposes a portion of the drain 250b.

Figure 2I:
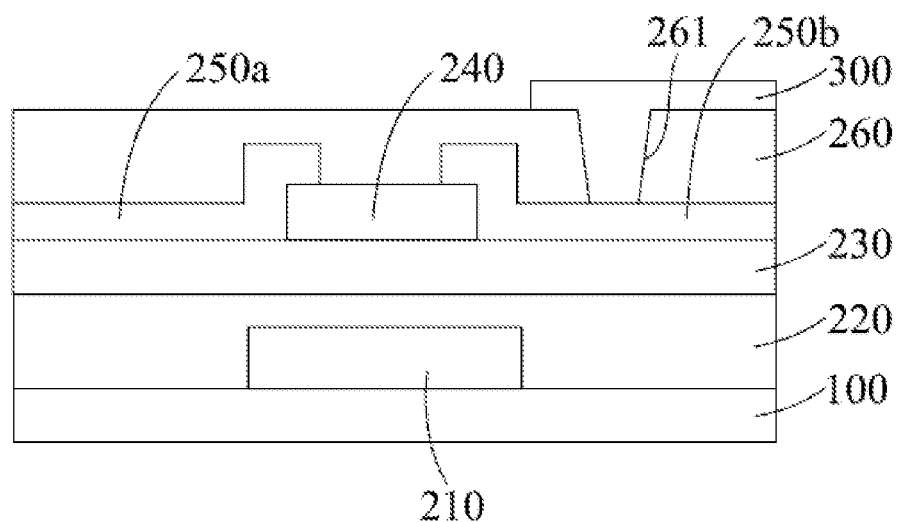

In step 9: referring to FIG. 2I, forming the pixel electrode 300 on the passivation layer 260. The pixel electrode 300 connects to the drain 250b exposed by the through hole 261.

In view of the above, by applying the flattening process to the surface of the gate insulation layer and by forming the oxygen-rich layer on the gate insulation layer, the surface of the gate insulation layer is smooth so as to eliminate the oxygen vacancy defects on the surface of the gate insulation layer. Thus, the surface state of the gate insulation layer is stable.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array substrate, comprising:
   a substrate;
   a gate on the substrate;
   a gate insulation layer on the substrate and the gate;
   an oxygen-rich layer being formed on an entire surface of the gate insulation layer;
   an active layer on the oxygen-rich layer;
   a source and a drain on the active layer, and wherein the source and drain extend onto the oxygen-rich layer to cover areas on the oxygen-rich layer except for the active layer;
   a passivation layer on the active layer, the source, and the drain;
   a pixel electrode on the passivation layer having a through hole exposing the drain, and the pixel electrode connects to the drain via the through hole.

2. The array substrate as claimed in claim 1, wherein the active layer is made by Indium Gallium Zinc Oxide (IGZO).

3. A manufacturing method of TFTs, comprising:
   providing a substrate;
   forming a gate on the substrate;
   forming a gate insulation layer on the substrate and the gate, and applying a flattening process to a surface of the gate insulation layer;
   forming an oxygen-rich layer on the gate insulation layer by applying the zone water of 20 PPM to 30 PPM for 60 to 90 seconds to an entire surface of the gate insulation layer;
   forming an active layer on the oxygen-rich layer;

forming a source and a drain on the active layer, and wherein the source and drain extend onto the oxygen-rich layer to cover areas on the oxygen-rich layer except for the active layer;

forming a passivation layer on the source, the drain, and the active layer.

4. The manufacturing method as claimed in claim 3, wherein the step of applying the flattering process to the surface of the gate insulation layer further comprises: a surface of the gate insulating layer is treated with hydrofluoric acid having a mass percentage equaling to 0.5 to 2% for 30 seconds to 120 seconds.

5. The manufacturing method as claimed in claim 3, wherein the step of forming the active layer on the oxygen-rich layer further comprises: depositing IGZO on the oxygen-rich layer to form an IGZO layer and applying a patterning process to the IGZO layer.

* * * * *